United States Patent [19]

Kuroda et al.

[11] 4,426,703

[45] Jan. 17, 1984

[54] SEMICONDUCTOR LASER DEVICE

[75] Inventors: Takao Kuroda, Kokubunji; Takashi Kajimura; Jun-ichi Umeda, both of Hachioji; Katsutoshi Saito, Higashiyamato, all of Japan

[73] Assignee: Hitachi, Ltd., Tokyo, Japan

[21] Appl. No.: 272,039

[22] Filed: Jun. 9, 1981

[30] Foreign Application Priority Data

Jun. 20, 1980 [JP] Japan .................................. 55/82881

[51] Int. Cl.³ .............................................. H01S 3/19
[52] U.S. Cl. .......................................... 372/46; 357/17
[58] Field of Search ....................... 372/45, 46; 357/17

[56] References Cited

U.S. PATENT DOCUMENTS 3,993,964 11/1976 Yonezu .................................. 372/46
4,328,469 5/1982 Seifres et al. ......................... 372/45

*Primary Examiner*—James W. Davie

*Attorney, Agent, or Firm*—Kenyon & Kenyon

[57] ABSTRACT

In a semiconductor laser device wherein a stripe-shaped impurity-diffused region is disposed in at least parts of semiconductor layers of from a surface semiconductor layer of a semiconductor layer assembly constituting the semiconductor laser device to a second semiconductor layer lying in contact with a first semiconductor layer having an active region, the impurity-diffused region having the same conductivity type as that of the second semiconductor layer and extending at least from the surface semiconductor layer to a depth vicinal to the first semiconductor layer, the impurity region serving as a current path; a semiconductor laser device characterized in that a third semiconductor layer in which the diffusion rate of an impurity for use in the formation of the impurity-diffused region is lower than in the second semiconductor layer is disposed between the surface semiconductor layer and the second semiconductor layer.

8 Claims, 7 Drawing Figures

SEMICONDUCTOR LASER DEVICE

BACKGROUND OF THE INVENTION

This invention relates to a semiconductor laser device.

In recent years, semiconductor laser devices have been expected as light sources for optical communication, laser printers, instrumentation etc. In exciting the semiconductor laser devices, a method of carrier injection has been employed owing to such many advantages that a high light conversion efficiency is generally attained and that the optical output can be readily modulated by directly controlling the injection current.

In case of exciting the semiconductor laser device by the method of carrier injection, it is common practice to put the device into the so-called stripe-geometry laser with a narrowed active region in order to permit the operation of the device with a low threshold current and to facilitate the control of the oscillation mode of the laser.

Concrete examples of the stripe-geometry laser are described in U.S. Pat. Nos. 3,920,491, Re. 29,395, etc.

This semiconductor laser device includes a narrow elongated semiconductor region of the same conductivity type as that of another semiconductor region lying in the vicinity of the active region of the laser device. The elongated region extends in depth from the surface of the device to the vicinity of the active region. A surface semiconductor layer of the opposite conductivity type covers the entire surface of the device except for the elongated region.

SUMMARY OF THE INVENTION

An object of this invention is to provide, in a semiconductor laser device employing a stripe-shaped impurity-diffused region for injecting current into an active region, a novel structure which makes the available percentage of the manufacture of the semiconductor laser devices very high.

In a semiconductor laser device wherein a stripe-shaped impurity-diffused region is disposed in at least parts of semiconductor layers of from a surface semiconductor layer of a semiconductor layer assembly constituting the semiconductor laser device to a second semiconductor layer lying in contact with a first semiconductor layer having an active region, the impurity-diffused region having the same conductivity type as that of the second semiconductor layer and extending at least from the surface semiconductor layer to a depth vicinal to the first semiconductor layer, an electrode being disposed on the impurity-diffused region so that current may flow in the forward direction from the electrode to the first semiconductor layer through the impurity-diffused region; this invention is characterized in that a third semiconductor layer in which the diffusion rate of an impurity for use in the formation of the impurity-diffused region is lower than in the second semiconductor layer is disposed between the surface semiconductor layer and the second semiconductor layer. Since the diffusion rate of the impurity is low in the third semiconductor layer, the control of the depth of the impurity-diffused region is facilitated.

In an example of a GaAs-GaAlAs-system double-heterostructure injection laser, GaAlAs is usually used for the second semiconductor layer, Zn or the like as the impurity for forming the impurity-diffused region, and GaAs for the surface semiconductor layer.

In order to realize a GaAs-GaAlAs-system semiconductor laser device which emits the visible radiation, the mole fraction of AlAs (u) in $Ga_{1-u}Al_uAs$ needs to be made large. This intends to enhance the transfer efficiency of the visible radiation. However, when the mole fraction of AlAs in GaAlAs is large, the diffusion rate of Zn increases abruptly. Simultaneously, the depths of the impurity-diffused regions disperse very greatly and become difficult of control in practice. Accordingly, troubles in which the impurity region extends over the greater part of the second semiconductor layer or reaches the active region occur frequently.

Especially in the GaAlAs material in which the mole fraction of AlAs (u) is at least 0.45, not only the diffusion rate increases, but also the dispersion of the diffusion depths becomes conspicuous. When u is 0.5 or greater, the dispersion becomes very conspicuous, and such material is difficult of practical use. Further, it becomes difficult to form a grown layer of good quality. In case where the GaAlAs material as described above is used for the second semiconductor layer of the semiconductor laser device, the third semiconductor layer is inserted between the second semiconductor layer and the surface semiconductor layer, and the impurity diffusion rate in this third semiconductor layer is selected to be lower than that in the second semiconductor layer, whereby the diffusion depth of the impurity can be controlled favorably. In using GaAlAs for the third semiconductor layer, u should preferably be 0.1 to 0.35.

DETAILED DESCRIPTION OF THE INVENTION

Figure 1:
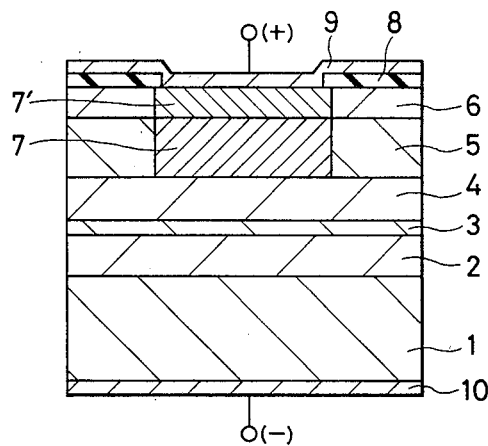
FIG. 1 is a partial vertical cross-sectional view of a semiconductor laser device according to one embodiment of the invention.
Figure 2:
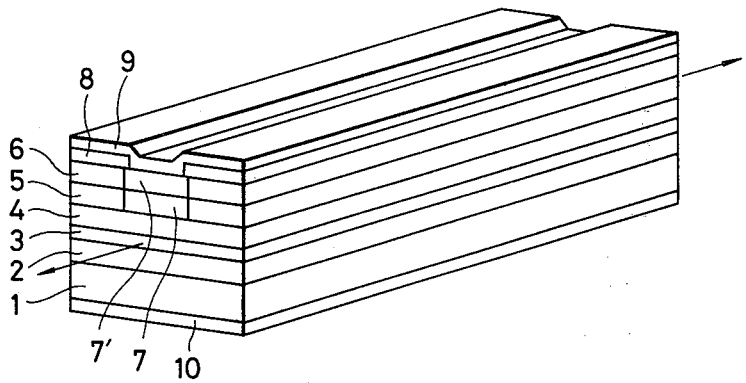
FIG. 2 is a perspective view of the semiconductor laser device of FIG. 1.

FIG. 1 is a sectional view of a semiconductor laser device embodying this invention, while FIG. 2 is a perspective view of the embodiment.

On an n-GaAs substrate 1 which has the (100) face as its upper surface, an $n-Ga_{0.4}Al_{0.6}As$ layer 2 is formed to a thickness of 1.5 μm, an $n-Ga_{0.75}Al_{0.25}As$ layer 3 to a thickness of 0.1 μm, a $p-Ga_{0.4}Al_{0.6}As$ layer 4 to a thickness of 1.5 μm, a $p-Ga_{0.8}Al_{0.2}As$ layer 5 to a thickness of 1 μm, and an n-GaAs layer 6 to a thickness of 1 μm. Each semiconductor layer may be formed according to the conventional liquid phase epitaxial growth process.

The n-GaAs layer 3 corresponds to the first semiconductor layer stated before, and has the active region. The $p-Ga_{0.4}Al_{0.6}As$ layer 4 corresponds to the second semiconductor layer, the $p-Ga_{0.8}Al_{0.2}As$ layer 5 to the third semiconductor layer, and the n-GaAs layer 6 to the surface semiconductor layer.

In the double-heterostructure injection laser of the GaAs-GaAlAs system, the first semiconductor layer is made of $Ga_{1-x}Al_xAs$ ($0 \leq X \leq 0.5$), and the cladding layers holding it therebetween are made of $Ga_{1-y}Al_yAs$ ($0.2 \leq y \leq 0.8$), x and y being so related as $x < y$. Regarding the thicknesses of the layers, the first semiconductor layer is set at 0.05 μm–0.3 μm, and the cladding layer at 1.0 μm–3.0 μm. The surface semiconductor layer is necessary (1) for preventing the semiconductor layers under manufacture from oxidizing, (2) for protecting the semiconductor layers in case of washing the semiconductor layer assembly, and (3) for reducing a contact resistance for an electrode which is disposed thereon. For these purposes, GaAs is the most preferable, and the thickness of the surface semiconductor layer is usually made 0.5 μm–1.5 μm.

On the n-GaAs layer 6, an $Al_2O_3$ layer 8 is formed. In this layer 8, a window which is 3.0 μm wide is provided by applying the well-known photolithographic process. Through the window, Zn is selectively diffused to be 2 μm deep, that is, to diffuse in the n-GaAs layer 6 and the p-$Ga_{0.8}Al_{0.2}As$ layer 5.

In the figures, regions indicated by symbols 7 and 7' correspond to the Zn-diffused region.

Thereafter, stacked layers of Au and Cr are formed as a p-side electrode 9, and an Au-Ge-Ni alloy is deposited as an n-side electrode 10. The crystal is cloven at the opposing (110) faces (or faces equivalent thereto) to form an optical resonator and to construct the semiconductor laser device. The cavity length is 300 μm.

In an example of the embodiment, the semiconductor laser could oscillate at a threshold current density of approximately 2 $kV/cm^2$ at the room temperature. The oscillation wavelength was 7,500 Å, and the external quantum efficiency was approximately 40%. Arrows in FIG. 2 indicate the emerging directions of laser radiation.

Now, the advantages of this invention will be described by referring to an example of a prior-art structure.

Figure 3:
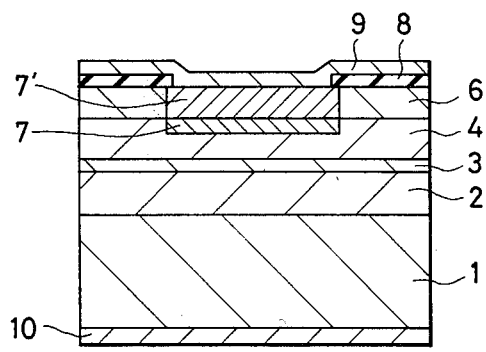
FIG. 3 is a partial vertical cross-sectional view of a semiconductor laser device according to one example of the prior art.

FIG. 3 is a sectional view showing a typical example of a GaAs-GaAlAs-system semiconductor laser which has heretofore been used. On a GaAs substrate 1, an n-$Ga_{0.4}Al_{0.6}As$ layer 2 is formed to a thickness of 1.5 μm, an n-$Ga_{0.75}Al_{0.25}As$ layer 3 to a thickness of 0.3 μm, a p-$Ga_{0.4}Al_{0.6}As$ layer 4 to a thickness of 1.5 μm, and an n-GaAs layer 6 to a thickness of 1 μm. In parts of the n-GaAs layer 6 and the p-$Ga_{0.4}Al_{0.6}As$ layer 4, a Zn-diffused region at 7 and 7' is formed. The n-GaAs layer 3 corresponds to the first semiconductor layer described before, the p-$Ga_{0.4}Al_{0.6}As$ layer 4 to the second semiconductor layer, and the n-GaAs layer 6 to the surface semiconductor layer. Numeral 8 designates an insulator layer, and numerals 9 and 10 designate electrodes respectively.

In case where the diffusion depth of the impurity-diffused layer 7 is precisely controlled as illustrated in FIG. 3, no problem occurs. As stated before, however, when the mole fraction of AlAs in the p-$Ga_{0.4}Al_{0.6}As$ layer 4 becomes 0.45 or above, the diffusion rate of Zn increases and the diffusion depth thereof disperses greatly. In practice, accordingly, the control becomes difficult.

Figure 4:
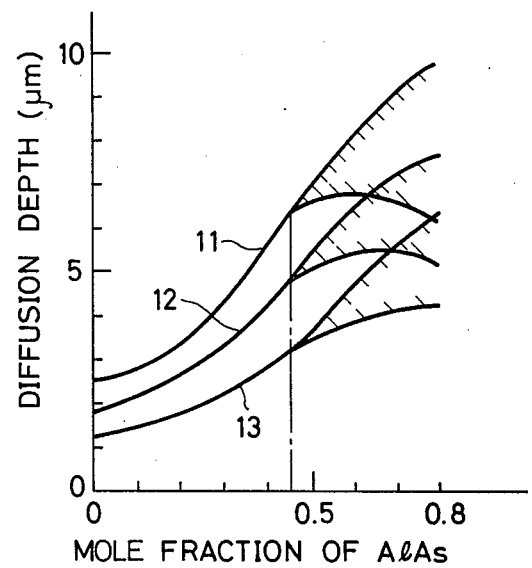
FIG. 4 is a graph showing the relationship between the diffusion depth and the mole fraction of AlAs.

FIG. 4 illustrates the relationship of the diffusion depth versus the mole fraction of AlAs at the time when Zn was diffused into a $Ga_{1-x}Al_xAs$ crystal. Curves 11, 12 and 13 indicate the characteristics obtained when Zn was diffused at 700° C., 670° C. and 640° C. for 50 minutes, respectively. From this graph, it is understood that the diffusion depths disperse when the mole fraction of AlAs is 0.45 or greater. The tendency of the dispersion was similarly noted in experiments which were conducted at diffusion temperatures of 600°–800° C. and for diffusion times of 1–300 minutes.

Figure 5:
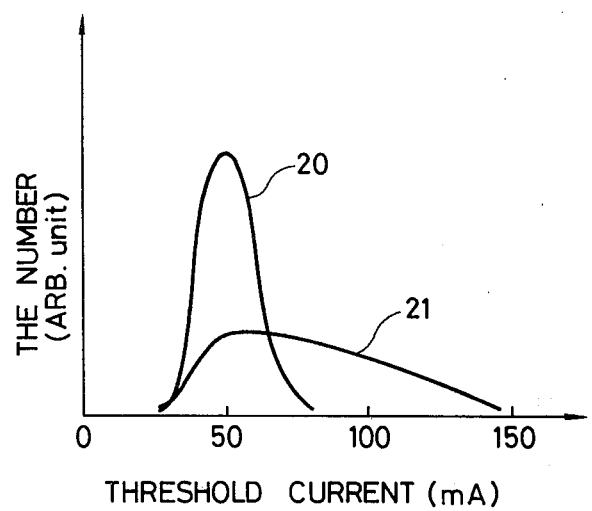
FIG. 5 is a graph showing the threshold current distribution of the semiconductor laser devices.

Shown in FIG. 5 are the distributions of the threshold currents of manufactured samples of the semiconductor laser having the structure of FIG. 3 and the semiconductor laser according to this invention. A curve 20 corresponds to the semiconductor laser of this invention, and a curve 21 to the prior-art semiconductor laser in FIG. 3. The specification of the respective semiconductor lasers are as exemplified before. It is understood that the dispersion of the characteristics of the semiconductor laser products becomes very small owing to the application of this invention.

In the embodiment, the third semiconductor layer 5 is made of the p-type GaAlAs, and the surface semiconductor layer 6 is made of the n-type GaAs. Owing to this fact, when current is caused to flow through the semiconductor laser in the forward direction, the interface between the p-GaAlAs layer and the n-GaAs layer is reverse-biased, so that the leakage current is prevented. A greater band gap can be established at the junction between GaAs and GaAlAs, than at a p-n junction in an identical material. Therefore, the measure is very useful for the prevention of the leakage current.

In addition, since the mole fraction of AlAs decreases in the order of the second semiconductor layer, the third semiconductor layer and the surface semiconductor layer, crystal lattices are matched more easily.

In case where the mole fraction of AlAs in the third semiconductor layer is less than 0.1, the following advantage is also brought forth. In this case, the difference between the third semiconductor layer and the GaAs (crystal) as the surface semiconductor layer formed thereon becomes indistinct. More specifically, although the diffusion depth needs to be measured from the surface of the GaAs surface layer formed on the GaAlAs layer, the boundary between the GaAlAs and GaAs layers cannot be distinguished in this case. Herein, the boundary between GaAs and GaAlAs is permitted to be visually observed with a microscope when the polished portion of the crystal is etched with, for example, fluoric acid, hydrogen peroxide and water (at a mixing ratio of 1:1:5). The visual discrimination thus realized is very convenient and practical in the sampling inspection of the mass-produced articles.

The third semiconductor layer 5 is made at least 0.5 μm thick. However, it is unnecessary to make the layer very thick. This is because a resistance which is connected in series with the active region of the semiconductor laser increases with the thickness of the layer.

Although the GaAs-GaAlAs system has been referred to in the foregoing concrete example, this invention is of course applicable to other material systems, for example, a Ga-Al-As-Sb system, a Ga-Al-As-P system, a Ga-As-P system and an In-Ga-As-P system. The technical idea of this invention is also applicable to a semiconductor laser of a construction having conductivity types opposite to those of the concrete example.

Figure 6:
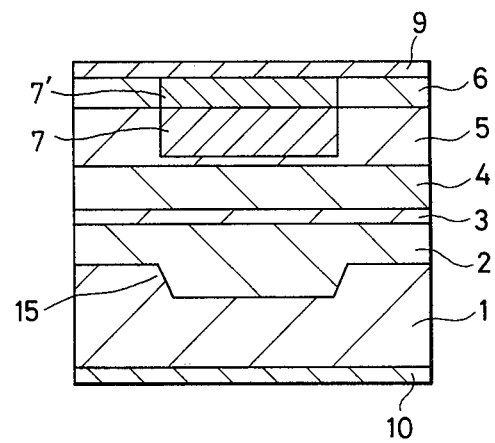
FIGS. 6 and 7 are partial vertical cross-sectional views of semiconductor laser devices according to other embodiments of the invention.

Needless to say, this invention is applied to various modified semiconductor lasers. FIG. 6 is a sectional view showing another embodiment of this invention. This embodiment differs from the embodiment of FIG. 1 in that the semiconductor substrate 1 is provided with a beltlike recess 15. It is intended to make the mode control in the lateral direction by exploiting an optical characteristic change at the boundary of the recess 15. The mode control means is disclosed in, for example, the official gazette of Japanese Laid-open Patent Application No. 52-143787 (HITACHI). In the figure, the same numerals as in FIG. 1 indicate the same parts.

In an example of the embodiment in FIG. 6, a photoresist film having a window 10 μm wide was formed by the conventional photoresist process the an n-GaAs substrate 1 which had the (100) face as its upper surface. The surface of the substrate was chemically etched through the window at 20° C. by the use of, for example, phosphoric acid: hydrogen peroxide: ethylene glycol = 1:1:3, whereby the groove 15 concave in the depth direction was formed. The width of the groove was made about 10 μm (usually, 5–20 μm), and the depth 1.5 μm (usually, 0.8–2.5 μm). Subsequently, the layers 2, 3, 4, 5 and 6 were grown on the resultant substrate by the continuous liquid phase growth.

While the continuous liquid phase growth may conform with a well-known method, solution compositions and growth times which were used for forming the respective semiconductor layers are listed in Table 1 by way of example.

TABLE 1

|  |  | Layer 2 | Layer 3 | Layer 4 | Layer 5 | Layer 6 |
|---|---|---|---|---|---|---|
| Solution Composition | Ga (gr) | 6 | 6 | 6 | 6 | 6 |
|  | GaAs (mg) | 400 | 400 | 400 | 400 | 400 |
|  | Al (mg) | 10 | 3 | 10 | 2 | — |
|  | Sn (mg) | — | — | — | — | 200 |
|  | Te (mg) | 0.5 | — | — | — | — |
|  | Ge (mg) | — | — | — | 200 | — |
|  | Zn (mg) | — | — | 30 | — | — |
| Growth time |  | 2 min. | 2 sec. | 8 min. | 3 min. | 1 min. |

The saturated solution had its temperature lowered at a rate of about 0.4° C./min. from 780° C. and was overcooled for 3 minutes. Thereafter, the solutions were successively brought into contact with the substrate. Thus, the layer 2 had its thicker part made 2 μm thick and had its thinner part made 0.3 μm thick. The thicknesses of the layers 3, 4, 5 and 6 were 0.1 μm, 2 μm, 2 μm and 1 μm respectively. As dopant impurities, Sn was used for the n-type layers, and Ge for the p-type layers. Subsequently, through a window in $Al_2O_3$ as was formed via the same photoresist process as in the previous case, Zn was diffused at 700° C. for 10 minutes, to form the p-type diffused region at 7 and 7' which was 1.0–3.0 μm deep. Thereafter, Au and Cr, and an Au-Ge-Ni alloy were respectively deposited as the positive electrode 9 and the negative electrode 10. Lastly, the crystal was cloven at the (110) faces so as to obtain opposite parallel surfaces. Then, a reflector was formed to construct the laser device. The laser length was 300 μm.

The semiconductor laser could oscillate at a threshold current density of approximately 2 kA/cm² at the room temperature. The oscillation wavelength was approximately 7,500 Å, and the external quantum effect was approximately 40%.

Figure 7:
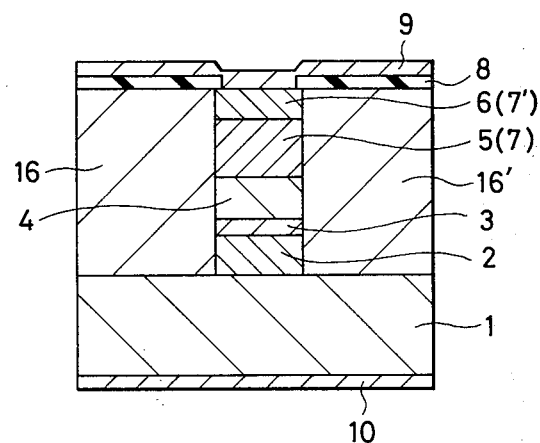

This invention is also applicable to the so-called buried heterostructure injection laser whose active region is buried in a different kind of semiconductor region. FIG. 7 is a sectional view showing such an embodiment. The first semiconductor layer 3 is held between burying layers 16 and 16' sidewards. This structure is described in, for example, U.S. Pat. No. 4,121,177. Also in this case, the object can be satisfactorily accomplished by diffusing Zn into the third semiconductor layer 5 and the surface semiconductor layer 6 and thus forming the impurity-diffused region at 7 and 7'. In the figure, parts assigned the same numerals as in FIG. 1 are the same parts.

What is claimed is:

1. In a semiconductor laser device comprising:
   (a) a substrate;
   (b) a plurality of semiconductor layers disposed on said substrate including:
      (1) a first semiconductor layer having an active region;
      (2) a second semiconductor layer disposed over and in contact with said first semiconductor layer; and
      (3) a surface semiconductor layer over said second semiconductor layer;
   (c) a stripe shaped impurity diffused region in at least parts of said semiconductor layers extending from the outer surface of said surface semiconductor layer to said second semiconductor layer to a depth in the vicinity of said first semiconductor layer, said impurity diffused region having the same conductivity type as that of the second semiconductor layer;
   (d) an electrode disposed on said impurity diffused region at the outer surface of said surface semiconductor layer so that current may flow from said electrode to said first semiconductor layer through the impurity diffused region, the improvement comprising:
   (e) a third semiconductor layer selected to have a diffusion rate for the impurity used in said impurity diffused region which is lower than the diffusion rate in said second semiconductor layer, interposed between said surface semiconductor layer and said second semiconductor layer.

2. A semiconductor laser device according to claim 1, wherein said first semiconductor layer is sandwiched in between said second and a fourth semiconductor layer, and said second semiconductor layer has opposite conductivity type to that of said fourth semconductor layer.

3. A semiconductor laser device according to claim 1 or 2, wherein said second semiconductor layer and said third semiconductor layer have the same conductivity type.

4. A semiconductor laser device according to claim 2, wherein said first semiconductor layer is a $Ga_{1-x}Al_xAs$ layer, said second semiconductor layer is a $Ga_{1-y}Al_yAs$ layer (where x<y), said fourth semiconductor layer is a $Ga_{1-y'}Al_{y'}As$ layer and said second semiconductor layer and said third semiconductor layer have the same conductivity type.

5. A semiconductor laser device according to claim 2, wherein said first semiconductor layer is a $Ga_{1-x}Al_xAs$ layer, said second semiconductor layer is a p-type $Ga_{1-y}Al_yAs$ layer (where x<y), said third semiconductor layer is a p-type $Ga_{1-z}Al_zAs$ layer, said fourth semiconductor layer is a n-type $Ga_{1-y'}Al_{y'}As$ layer (where x<y'), said surface semiconductor layer is a GaAs layer, the impurity is an impurity turning GaAlAs into the p-type, and y>z.

6. A semiconductor laser device according to claim 1 or 2, wherein said second semiconductor layer and said third semiconductor layer have the same conductivity type, and said surface semiconductor layer has the conductivity type opposite thereto.

7. A semiconductor laser device according to claim 1 or 2, wherein said impurity is Zn.

8. A semiconductor laser device according to claim 6, wherein said second semiconductor layer is a p-type $Ga_{1-y}Al_yAs$ ($0.45 < y < 0.8$) layer, said third semiconductor layer is a p-type $Ga_{1-z}Al_zAs$ ($0.1 \leq z \leq 0.35$) layer, and said surface semiconductor layer is an n-type GaAs layer.

* * * * *